United States Patent
Teng et al.

(10) Patent No.: US 7,206,663 B2
(45) Date of Patent: Apr. 17, 2007

(54) CALIBRATION CASSETTE POD FOR ROBOT TEACHING AND METHOD OF USING

(75) Inventors: Kuo-Hsing Teng, Hsin Chu (TW); Fu-Shun Lo, Hsinchu (TW); Yi-Chang Tsai, Hsinchu (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 0 days.

(21) Appl. No.: 11/370,540

(22) Filed: Mar. 7, 2006

(65) Prior Publication Data

US 2006/0184270 A1 Aug. 17, 2006

Related U.S. Application Data

(62) Division of application No. 10/041,849, filed on Jan. 7, 2002, now Pat. No. 7,054,713.

(51) Int. Cl.
*G06F 7/00* (2006.01)
(52) U.S. Cl. .................................. 700/218; 700/259
(58) Field of Classification Search ............. 700/213, 700/218, 258, 259; 414/935–937, 939, 941
See application file for complete search history.

(56) References Cited

U.S. PATENT DOCUMENTS

| | | | | |
|---|---|---|---|---|
| 4,786,816 A | * | 11/1988 | Ohmori et al. | 250/559.12 |
| 4,803,373 A | * | 2/1989 | Imamura et al. | 250/559.29 |
| 4,819,167 A | * | 4/1989 | Cheng et al. | 700/59 |
| 4,895,486 A | * | 1/1990 | Baker et al. | 414/331.15 |
| 5,225,691 A | * | 7/1993 | Powers et al. | 250/559.4 |
| 5,239,182 A | * | 8/1993 | Tateyama et al. | 250/559.37 |
| 5,308,993 A | * | 5/1994 | Holman et al. | 250/559.4 |
| 5,466,945 A | * | 11/1995 | Brickell et al. | 250/559.12 |
| 5,483,138 A | * | 1/1996 | Shmookler et al. | 318/568.16 |
| 5,604,443 A | * | 2/1997 | Kitamura et al. | 324/754 |
| 5,636,960 A | * | 6/1997 | Hiroki et al. | 414/781 |
| 5,783,834 A | * | 7/1998 | Shatas | 250/559.33 |
| 5,844,683 A | * | 12/1998 | Pavloski et al. | 356/399 |
| 5,906,469 A | * | 5/1999 | Oka et al. | 414/416.08 |
| 5,981,966 A | * | 11/1999 | Honma | 250/559.33 |
| 6,013,920 A | * | 1/2000 | Gordon et al. | 250/559.36 |
| 6,075,334 A | * | 6/2000 | Sagues et al. | 318/568.11 |
| 6,145,673 A | * | 11/2000 | Burrows et al. | 211/41.18 |
| 6,147,356 A | * | 11/2000 | Hahn et al. | 250/559.29 |
| 6,188,323 B1 | * | 2/2001 | Rosenquist et al. | 340/686.5 |
| 6,236,904 B1 | * | 5/2001 | Nakamura | 700/218 |

(Continued)

*Primary Examiner*—Khoi H. Tran
(74) *Attorney, Agent, or Firm*—Tung & Associates

(57) ABSTRACT

A calibration cassette pod for robot teaching and a method of using the calibration cassette pod are described. In the calibration cassette pod, a cassette pod body and a cassette pod door are first provided wherein the cassette pod body is constructed of a top panel, a bottom panel, two side panels and a front panel to enclose a cavity therein. A first plurality of ribs is formed on an inside surface of the cassette pod body, each having a predetermined depth sufficient to support an edge portion of a wafer. An optical detector housing is mounted on an opening in the front panel and is adapted for receiving an optical detector therein. An optical detector that includes a light emission source and a photo diode receiver for determining the position of the edge portion of the wafer is mounted in the optical detector housing.

5 Claims, 2 Drawing Sheets

U.S. PATENT DOCUMENTS

| | | | |
|---|---|---|---|
| 6,300,644 B1 * | 10/2001 | Beckhart et al. | 250/559.33 |
| 6,303,939 B1 * | 10/2001 | Chung et al. | 250/559.29 |
| 6,388,436 B1 * | 5/2002 | Nodot et al. | 324/158.1 |
| 6,430,468 B1 * | 8/2002 | Tepman et al. | 700/218 |
| 6,542,839 B1 * | 4/2003 | Lu et al. | 702/94 |
| 6,745,901 B2 * | 6/2004 | Chen et al. | 206/711 |
| 6,789,328 B2 * | 9/2004 | Beckhart et al. | 33/645 |
| 6,827,825 B2 * | 12/2004 | Feltsman et al. | 204/192.13 |
| 6,915,183 B2 * | 7/2005 | Iida et al. | 700/218 |
| 2003/0046998 A1 * | 3/2003 | Seita | 73/431 |

* cited by examiner

CALIBRATION CASSETTE POD FOR ROBOT TEACHING AND METHOD OF USING

This is a divisional of application(s) Ser. No. 10/041,849 was filed on Jan. 7, 2002 now U.S. Pat. No. 7,054,713.

FIELD OF THE INVENTION

The present invention generally relates to a calibration cassette pod for robot teaching and method of using and more particularly, relates to a cassette pod equipped with an optical detector including a light emission source and a photo diode receiver for detecting the positioning of a wafer edge and thus, enables the calibration of a robot arm that delivers the wafer into the cassette pod and a method of using the calibration cassette pod.

BACKGROUND OF THE INVENTION

In the manufacturing of a semiconductor device, the device is usually processed at many work stations or processing machines. The transporting or conveying of partially finished devices, or work-in-process (WIP) parts, is an important aspect in the total manufacturing process. The conveying of semiconductor wafers is especially important in the manufacturing of integrated circuit chips due to the delicate nature of the chips. Furthermore, in fabricating an IC product, a multiplicity of fabrication steps, i.e. as many as several hundred, is usually required to complete the fabrication process. A semiconductor wafer or IC chips must be transported between various process stations in order to perform various fabrication processes.

For instance, to complete the fabrication of an IC chip, various steps of deposition, cleaning, ion implantation, etching and passivation steps must be carried out before an IC chip is packaged for shipment. Each of these fabrication steps must be performed in a different process machine, i.e. a chemical vapor deposition chamber, an ion implantation chamber, an etcher, etc. A partially processed semiconductor wafer must be conveyed between various work stations many times before the fabrication process is completed. The safe conveying and accurate tracking of such semiconductor wafers or work-in-process parts in a semiconductor fabrication facility is therefore an important aspect of the total fabrication process.

Conventionally, partially finished semiconductor wafers or WIP parts are conveyed in a fabrication plant by automatically guided vehicles (AGV) or overhead transport (OHT) vehicles that travel on predetermined routes or tracks. For the conveying of semiconductor wafers, the wafers are normally loaded into cassettes pods, such as SMIF (standard machine interface) or FOUP (front opening unified pod), and then picked up and placed in the automatic conveying vehicles. For identifying and locating the various semiconductor wafers or WIP parts being transported, the cassettes or pods are normally labeled with a tag positioned on the side of the cassette or pod. The tags can be read automatically by a tag reader that is mounted on the guard rails of the conveying vehicle.

An OHT system is frequently used to deliver a cassette pod such as a FOUP to a process machine. This is shown in FIG. 1. A cassette pod 10 of the FOUP type is positioned on a loadport 12 of a process machine 14. The loadport 12 is frequently equipped with a plurality of locating pins 16 for the proper positioning of the cassette pod 10. A detailed perspective view of the FOUP 10 is shown in FIG. 2. The FOUP 10 is constructed of a body portion 18 and a cover 28. The body portion 18 is provided with a cavity 46 equipped with a plurality of ribs 48 for the positioning of 25 wafers of the 300 mm size. The body portion 18 is further provided with sloped handles 50 on both sides of the body for ease of manual transportation. On top of the body portion 18, is provided with a plate member 52 for gripping by a transport arm (not shown) of an OHT system (not shown).

When the cassette pod 10 is positioned on the process machine 14, and the cover 28 is removed to expose an opening to cavity 46, a robot arm (not shown) equipped with a wafer blade (not shown) is used to unload wafers from the cassette pod 10 and deliver the wafers to the process chamber of the process machine 14. After the wafer has been processed in the process chamber, it is again transported by the robot arm back into the cassette pod 10. The operation or the movement of the robot arm therefore must be accurately calibrated for the wafer pick-up and delivery operations. When a FOUP is used for storing 300 mm wafers, the FOUP is frequently fabricated of a non-transparent plastic material. It is therefore difficult to visually detect the movement of the robot arm, i.e and thus the wafer blade, through the housing of the FOUP.

When a robot teaching is poor during an insulation process of the process machine or after a preventive maintenance procedure has been conducted, the poor robot teaching can lead to serious processing difficulties due to the inaccurate position of the robot arm, i.e. and thus the wafer blade. For instance, when a robot arm reaches into the cavity too deeply, an edge of the wafer may rub against the interior surface of the front panel of the housing and thus causing serious particle issues. On the other hand, if the robot arm does not reach deep enough into the cavity during the placement of a wafer and thus placing a wafer inaccurately in the cavity, the edge of the wafer may collide with the FOUP door during a door closing operation. The collision of the wafer with the FOUP door may cause serious damage to the wafer, or may even cause breakage of the wafer.

As a result, the robot teaching for picking up or delivering the wafer from or to a cassette pod cavity must be accurately performed. Presently, the robot teaching is conducted by visual examination with human eyes which is frequently inaccurate due to human error or the subjectiveness of the human operator.

It is therefore an object of the present invention to provide an apparatus for robot teaching that does not have the drawbacks or the shortcomings of the conventional apparatus.

It is another object of the present invention to provide a calibration cassette pod for robot teaching that can eliminate human error and human subjectiveness.

It is a further object of the present invention to provide a calibration cassette pod for robot teaching by installing an optical detector inside the calibration cassette pod.

It is another further object of the present invention to provide a calibration cassette pod for robot teaching wherein a light emission source and a photo diode receiver are installed to detect the position of an edge portion of a wafer.

It is still another object of the present invention to provide a calibration cassette pod for robot teaching that can be used in a portable manner for calibrating a plurality of robot arms.

It is yet another object of the present invention to provide a method for calibrating a robot arm by a calibration cassette pod that does not have the drawbacks or the shortcomings of the conventional method.

It is yet another object of the present invention to provide a method for calibrating a robot arm by a calibration cassette pod wherein a robot arm is first manually operated to load a wafer into a cassette cavity correctly to reset a process controller to zero.

SUMMARY OF THE INVENTION

In accordance with the present invention, a calibration cassette pod for robot teaching and a method of using the calibration pod are provided.

In a preferred embodiment, a calibration cassette pod for robot teaching is provided with include a cassette pod body and a cassette pod door, the cassette pod body is constructed of a top panel, a bottom panel, two side panels and a front panel defining a cavity therein; a first plurality of ribs formed on an inside surface of the two side panels and the front panel each has a preset depth sufficient for supporting an edge portion of a wafer; an optical detector housing mounted on an opening in the front panel adapted for receiving an optical detector therein; and an optical detector that includes a light emission source and a photo diode receiver for determining the position of the edge portion of the wafer.

In the calibration cassette pod for robot teaching, the light emission source may include a second plurality of light emission units and a second plurality of photo diode receivers. The second plurality may be at least three, and preferably at least five. The calibration cassette pod may further include a process controller for receiving signals from the optical detector and comparing to a stored datum. The light emission source may emit a visible light beam. The calibration cassette pod may further include a robot arm controlled by the process controller. The optical detector may be mounted in the optical detector housing with the second plurality of light emission units and the second plurality of photo diode receivers protruding into the cavity of the cassette pod body. The cassette pod body when installed on a loadport of a process machine with the cassette pod door removed, allows a robot arm to deliver/remove a wafer to/from the cavity.

The present invention is further directed to a method for calibrating a robot arm by a calibration cassette pod which includes the operating steps of first providing a cassette pod body and a cassette pod door, the cassette pod body is constructed of a top panel, a bottom panel, two side panels and a front panel defining a cavity therein; providing a first plurality of ribs on an inside surface of the two side panels and the front panel each has a preset depth sufficient to support an edge portion of a wafer; mounting an optical detector housing on an opening in the front panel adapted for receiving an optical detector therein, the optical detector may further include a light emission source and a photo diode receiver for determining the position of the edge portion of the wafer; providing a process controller for receiving signals from the light emission source and the photo diode receiver; manually operating the robot arm and loading a wafer into the cavity such that the edge portion of the wafer is positioned in-between the light emission source and the photo diode receiver and in a correct position on top of one of the first plurality of ribs; resetting a reading on the process controller to zero; and automatically operating the robot arm and loading a wafer into the cavity obtaining a new reading on the process controller and determining its deviation from zero.

The method for calibrating a robot arm by a calibration cassette pod may further include the step of providing a second plurality of light emission units and a second plurality of photo diode receivers. The method may further include the step of providing six light emission units arranged in a single row and six photo diode receivers arranged in a single row positioned in a mirror image to the six light emission units. The method may further include the step of resetting a reading on the process controller to zero when the edge portion of the wafer blocks three adjacent light emission units from three corresponding photo diode receivers. The method may further include the step of emitting a visible light beam from the light emission source.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a calibration cassette pod for robot teaching and a method of using the pod.

In a preferred embodiment, the present invention calibration cassette pod for robot teaching can be provided which includes a cassette pod body; a cassette pod door; a first plurality of ribs formed on an inside surface of the cassette pod body; an optical detector housing mounted on an opening in the cassette pod body; and an optical detector mounted inside the optical detector housing.

The cassette pod body of the present invention calibration cassette pod may be constructed of a top panel, a bottom panel, two side panels and a front panel which define a cavity formed therein. In a preferred embodiment, the top panel, the bottom panel and the two side panels are planar panels, while the front panel is a curvilinear panel. The first plurality of ribs, or ridges, are formed on an inside surface of the two side panels and the front panel. The first plurality of ribs should have a predetermined depth that is sufficient for supporting an edge portion of a wafer. The optical detector housing should be mounted on an opening that is provided in the front panel of the cassette pod body. The optical detector housing receives an optical detector which may include a light emission source and a photo diode receiver in the housing for determining the position of an edge of a wafer, i.e. for determining whether a wafer is placed too far into the slot opening, or not far enough into the slot opening of the housing.

Figure 1:
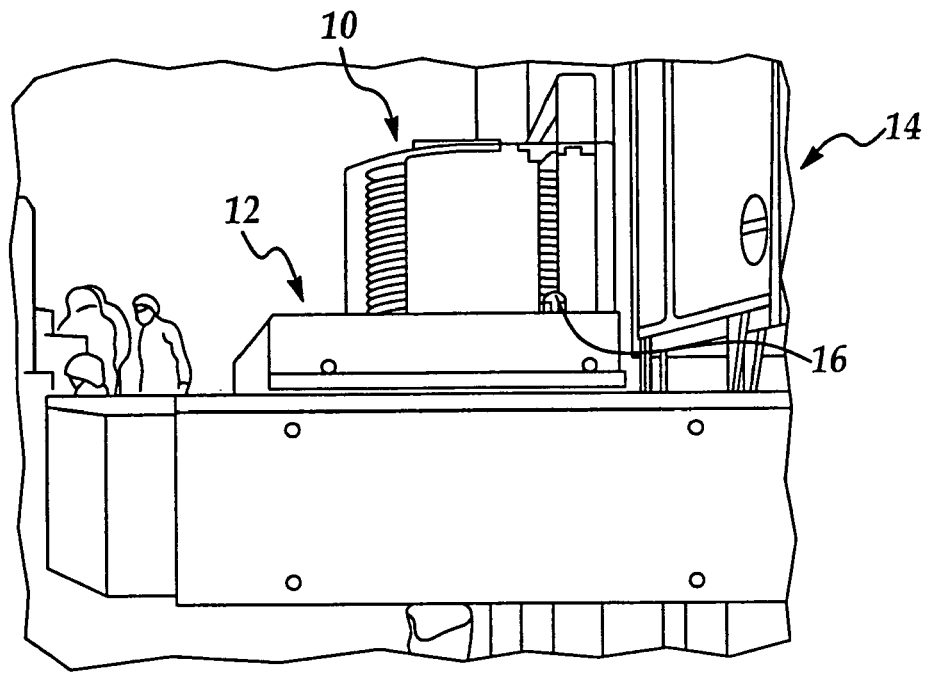
FIG. 1 is a perspective view of a cassette pod mounted on a loadport of a process machine.
Figure 2:
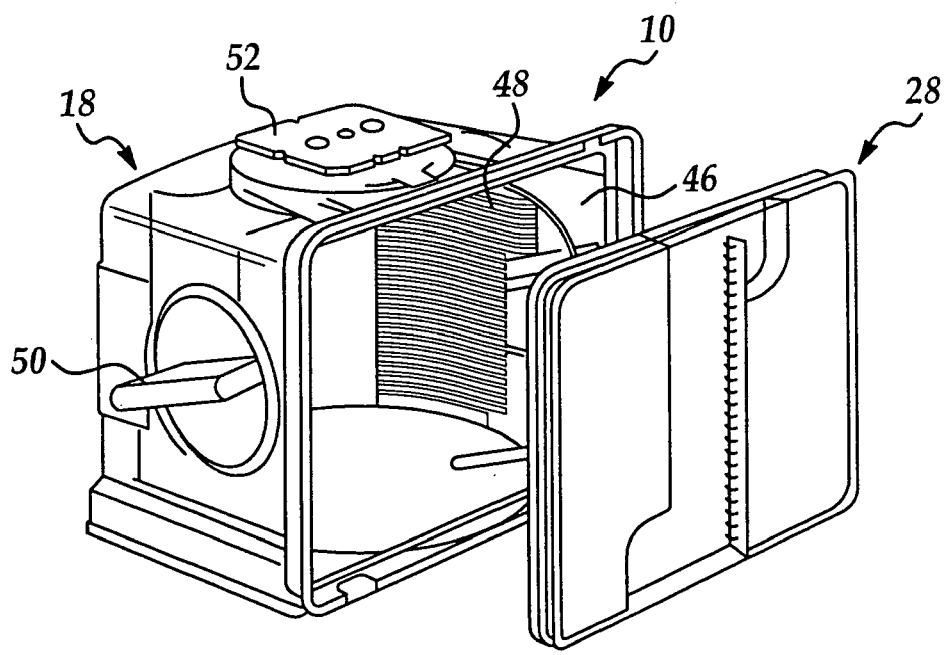
FIG. 2 is a perspective view of a cassette pod with a removable back panel for 300 mm wafers.
Figure 3:
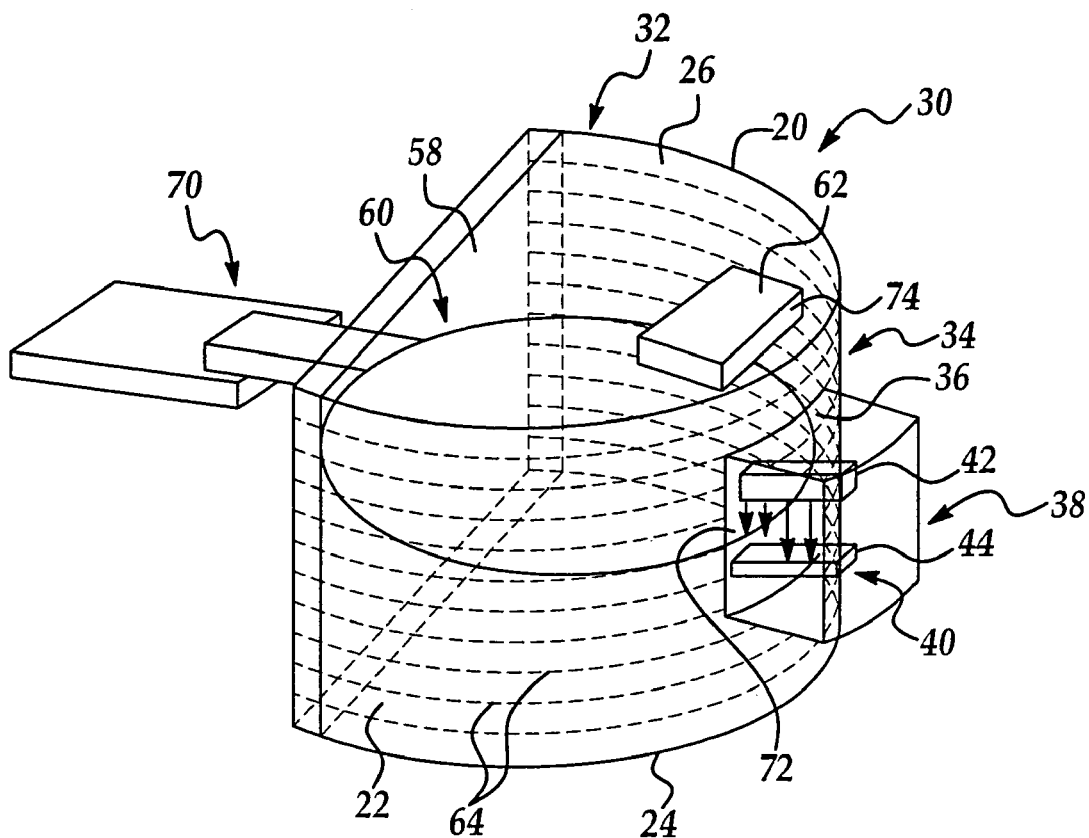
FIG. 3 is an exploded, perspective view of the present invention calibration cassette pod being accessed by a robot arm.

Referring now to FIG. 3, wherein an exploded, perspective view of the present invention calibration cassette pod 30 is shown. The cassette pod 30 is shown in a cassette pod body 32 with a cassette pod door (not shown) removed. The cassette pod body 32 shown in FIG. 3 is shown for illustration purposes only and therefore, does not necessarily represent the true shape of a cassette pod which is more likely similar to that shown in FIG. 2. In the front panel 34 of the cassette pod body 32, is provided an opening 36 onto which an optical detector housing 38 is mounted thereto. It should be noted that while the optical detector housing 38 is shown in a rectangular shape for illustration purposes, any other suitable shape may also be utilized.

Inside the optical detector housing 38 is mounted an optical detector 40 which consists of a light emission source 42 and a photo diode receiver 44. The light emission source 42 may consists of a plurality of light emission units, i.e. such as at least three light emission units, or preferably at least six light emission units 54, shown in FIG. 3A. Similarly, the same number of photo diode receivers 56 are provided and are positioned in mirror image to the six light emitting units 54 in a spaced-apart relationship. The distance between the light emission units 54 and the photo diode receivers 56 should be sufficient, i.e. at least two to three times the thickness of a wafer, to allow the placement of a wafer 60 therein between during a calibration process.

Also shown in FIG. 3 is a robot arm 70 which is equipped with a wafer blade (not shown) mounted at the tip portion of the robot arm for carrying a wafer 60 thereon. A numerical display panel 62 may also be provided and mounted on top of the top panel 26 of the cassette pod body 32. The digital display panel 62 may show a display of the distance into the optical detector 40 that the wafer 60 has penetrated. It should be noted that while six light emission units 54 and six photo diode receivers 56 are provided in the preferred embodiment, any other suitable numbers such as four, five or up to ten may be utilized when arranged in a straight line for detecting the presence of a wafer edge therein between.

Figure 3A:
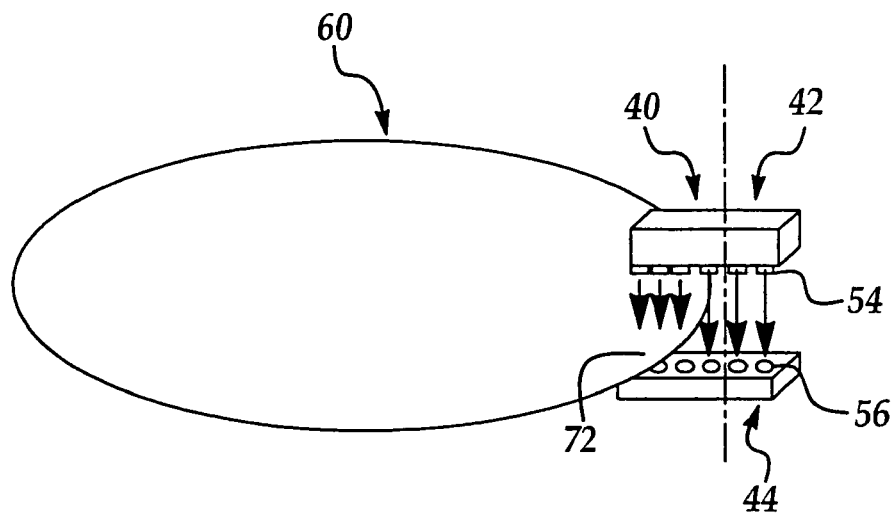
FIG. 3A is a perspective view of a wafer being positioned in-between a light emission source and a photo diode receiver for determining the position of the edge of the wafer.

The present invention novel method utilizing the apparatus shown in FIGS. 3 and 3A can be carried out by the following operating steps:

1. Providing a cassette pod body 32 and a cassette pod door (not shown in FIG. 3), the cassette pod body 32 may be constructed of a top panel 26, a bottom panel 24, two side panels 20, 22 and a front panel 34 to define a cavity 58 therein.
2. Providing a first plurality of ribs 64 on an inside surface of the two side panels 20, 22 and the front panel 34 such that each of the plurality of ribs has a preset depth sufficient to support an edge of a wafer 60.
3. Mounting an optical detector housing 38 on the opening 36 of the front panel 34. The optical detector housing 38 is adapted for receiving an optical detector 40 therein. The optical detector 40 may include a light emission source 42 and a photo diode receiver 40 for determining the position of the edge portion 72 of the wafer 60.
4. Providing a process controller 74 which has a digital display panel 62 mounted thereon for receiving signals from the light emission source 42 and the photo diode receiver 40.
5. Manually operating the robot arm 70 and loading a wafer 60 into the cavity 58 such that the edge portion 72 of the wafer 60 is positioned in-between the light emission source 42 and the photo diode receiver 40 and in a correct position on top of one of the plurality of ribs 64.
6. Resetting a reading on the digital display panel 62 of the process controller 74 to zero.
7. Automatically operating the robot arm 70 and loading a wafer 60 into the cavity 58 to obtain a new reading on the process controller 74 and determining its deviation from zero.

The present invention novel apparatus of a calibration cassette pod for robot teaching and a method for using the pod have therefore been amply described in the above description and in the appended drawings of FIGS. 3 and 3A.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for calibrating a robot arm by a calibration cassette pod comprising the steps of:

providing a cassette pod body and a cassette pod door, said cassette pod body being constructed of a top panel, a bottom panel, two side panels and a front panel defining a cavity therein;

providing a first plurality of ribs on an inside surface of said two side panels and said front panel each having a preset depth sufficient for supporting an edge portion of a wafer;

mounting an optical detector housing on an opening in said front panel adapted for receiving an optical detector therein, said optical detector comprising a light emission source and a photo diode receiver for determining the position of said edge portion of the wafer;

providing a process controller for receiving signals from said light emission source and said photo diode receiver;

manually operating said robot arm and loading a wafer into said cavity such that said edge portion of the wafer is positioned in-between said light emission source and said photo diode receiver and in a correct position on top of one of said first plurality of ribs;

resetting a reading on said process controller to zero; and automatically operating said robot arm and loading a wafer into said cavity obtaining a new reading on said process controller and determining its deviation from zero.

2. A method for calibrating a robot arm by a calibration cassette pod according to claim 1 further comprising the step of providing a second plurality of light emission units and a second plurality of photo diode receivers.

3. A method for calibrating a robot arm by a calibration cassette pod according to claim 1 further comprising the step of providing six light emission units arranged in a single row and six photo diode receivers in a single row positioned in a mirror image to said six light emission units.

4. A method for calibrating a robot arm by a calibration cassette pod according to claim 3 further comprising the step of resetting a reading on said process controller to zero when said edge portion of the wafer blocks three adjacent light emission units from three corresponding photo diode receivers.

5. A method for calibrating a robot arm by a calibration cassette pod according to claim 1 further comprising the step of emitting visible light beam from said light emission source.

* * * * *